United States Patent
Shah

(10) Patent No.: US 7,656,007 B2
(45) Date of Patent: Feb. 2, 2010

(54) PACKAGE SUBSTRATE WITH INSERTED DISCRETE CAPACITORS

(75) Inventor: Jitesh Shah, Fremont, CA (US)

(73) Assignee: Integrated Device Technology Inc., San Jose, CA (US)

( * ) Notice: Subject to any disclaimer, the term of this patent is extended or adjusted under 35 U.S.C. 154(b) by 287 days.

(21) Appl. No.: 11/590,940

(22) Filed: Nov. 1, 2006

(65) Prior Publication Data

US 2008/0099901 A1    May 1, 2008

(51) Int. Cl.
*H01L 23/34* (2006.01)
(52) U.S. Cl. .................. 257/532; 257/724; 438/107
(58) Field of Classification Search ............. 257/723, 257/724, 691, 532; 438/387, 396, 107, 109, 438/125
See application file for complete search history.

(56) References Cited

U.S. PATENT DOCUMENTS

| | | | |
|---|---|---|---|
| 6,388,207 B1 * | 5/2002 | Figueroa et al. ............ 174/262 |
| 6,430,059 B1 | 8/2002 | Hung et al. | |
| 6,998,308 B2 * | 2/2006 | Ooi et al. ................ 438/253 |
| 2006/0012966 A1 * | 1/2006 | Chakravorty ............ 361/763 |
| 2006/0191711 A1 * | 8/2006 | Cho et al. ................. 174/260 |
| 2006/0215380 A1 * | 9/2006 | Lu et al. .................. 361/763 |
| 2008/0079136 A1 * | 4/2008 | Li .......................... 257/691 |

* cited by examiner

*Primary Examiner*—S. V Clark
(74) *Attorney, Agent, or Firm*—Roeder & Broder LLP

(57) ABSTRACT

A package substrate (16) for electrically connecting an integrated circuit (12) to a printed circuit board (14) includes a core (222c), a patterned conductive layer (220c), a plurality of spaced apart, discrete capacitors (230), and an insulating layer (222b). The patterned conductive layer (220c) is positioned on the core (222c). The discrete capacitors (230) are electrically connected to the patterned conductive layer (220c). The insulating layer (222b) covers the patterned conductive layer (220c) and separates the capacitors (230). The capacitors (230) are positioned to provide a relatively low impedance path for quick access to power to stabilize the voltage delivered to the integrated circuit (12), and the capacitors (230) do not occupy valuable space on the integrated circuit (12), and the printed circuit board (14). Further, this placement of the capacitor assembly (18) allows for use of a relatively large number of discrete capacitors (230) without taking up valuable space from the surface of the package substrate (16).

19 Claims, 2 Drawing Sheets

PACKAGE SUBSTRATE WITH INSERTED DISCRETE CAPACITORS

BACKGROUND

Digital systems often include one or more integrated circuits (also referred to as "chips") that are coupled to one or more substrates, such as a printed circuit boards, using one or more package substrates. The printed circuit board provides power to the integrated circuit. The package substrate includes a plurality of power conductors and a plurality of ground conductors to electrically connect the integrated circuit to the printed circuit board.

Additionally, the digital system can include a plurality of decoupling capacitors that are connected between the power and ground conductors to help stabilize the voltage delivered to the integrated circuits. For example, when there is a sudden change in the current drawn by the integrated circuit, decoupling capacitors provide a local source of charge so that the current can be supplied quickly without causing the voltage across the power and ground nodes to dip suddenly. Inadequate decoupling leads to excessive power supply noise causing signal integrity and EMC problems, and ultimately adversely influencing the reliability of the product.

Presently, decoupling capacitors are placed on the integrated circuit, on the package substrate, and/or on the printed circuit board. The ability for the on-chip circuitry to access the charge stored in these capacitors depends on the impedance offered by the interconnect path to these capacitors. The impedance path to the on-chip or on-package substrate capacitors is relatively short and is useful to supply charge during very high frequency current transients. Unfortunately, the on-chip and the on-package substrate capacitors use valuable space. There is space for the capacitors on the printed circuit board, but the impedance path is relatively high and hence is not as effective during high frequency switching.

SUMMARY

The present invention is directed toward a package substrate for electrically connecting an integrated circuit to a printed circuit board. In one embodiment, the package substrate includes a first insulating layer, a patterned conductive layer, a plurality of spaced apart, discrete capacitors, and a second insulating layer. The patterned conductive layer is positioned on the first insulating layer. The discrete capacitors are electrically connected to the patterned conductive layer. The second insulating layer covers the patterned conductive layer and separates the capacitors. In certain embodiments, as a result of this design, the capacitors are positioned to provide a relatively low impedance path for quick access to power to stabilize the voltage delivered to the integrated circuit, and the capacitors do not occupy valuable space on the integrated circuit, and the printed circuit board. Further, this placement of the capacitors allows for use of a relatively large number of discrete capacitors without taking up valuable space from the surface of the package substrate without taking up routing space.

In one embodiment, the patterned conductive layer includes a ground rail and a power rail. Further, in this embodiment, at least one of the capacitors extends between and is directly electrically connected to the ground rail and the power rail. Moreover, a plurality of spaced apart capacitors can extend between and be directly connected to the ground rail and the power rail. Additionally, in certain embodiments, the discrete capacitors are positioned directly on the rails.

In another embodiment, the patterned conductive layer includes a plurality of spaced apart ground rails and a plurality of spaced apart power rails. In this embodiment, each of the capacitors extends between and is directly electrically connected to one of the ground rails and one of the power rails.

Additionally, the present invention is directed to a digital system that includes the integrated circuit, the printed circuit board, and the package substrate.

In yet another embodiment, the present invention is directed to a method for making a package substrate.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
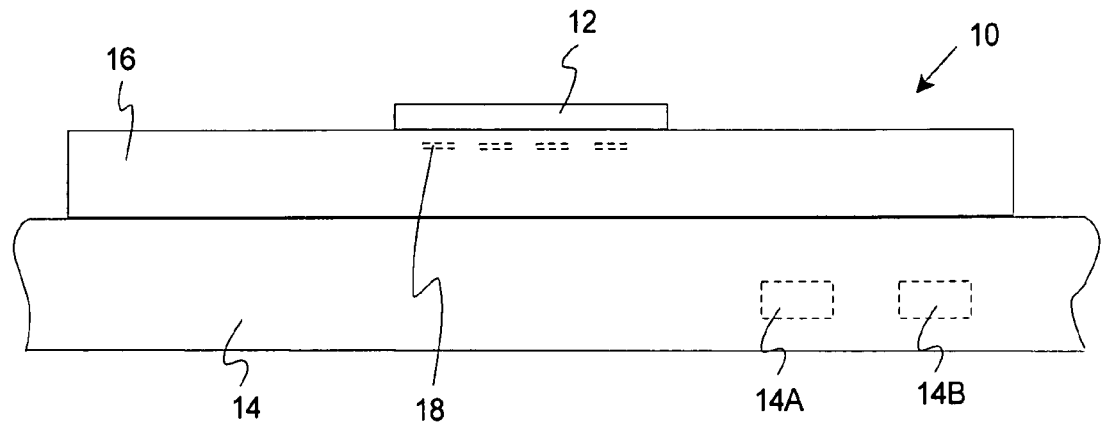
FIG. 1 is a simplified side view of a digital system having features of the present invention.

FIG. 1 is a simplified side view of a portion of a digital system 10 that includes an integrated circuit 12, a printed circuit board 14, and a package substrate 16 that attaches and electrically connects the integrated circuit 12 to the printed circuit board 14. The design of each of these components can vary pursuant to the teachings provided herein. As an overview, the package substrate 16 includes an inserted capacitor assembly 18 (illustrated in phantom). As a result of this design, in certain embodiments, the capacitor assembly 18 is positioned to provide a relatively low impedance path for quick access to power to stabilize the voltage delivered to the integrated circuit 12, and the capacitor assembly 18 does not occupy valuable space on the integrated circuit 12, and the printed circuit board 14. Further, this placement of the capacitor assembly 18 allows for use of a relatively large number of discrete capacitors without taking up valuable space from the surface of the package substrate 16.

The integrated circuit 12 consists of a number of circuit elements positioned on a chip of silicon crystal or other semiconductor material. The design of the integrated circuit 12 can vary. For example, the integrated circuit 12 can be a flip type chip as illustrated in FIG. 1, or a wire bond type chip.

Additionally, the digital system 10 can include a heat spreader (not shown) and one or more insulators (not shown) that are positioned near the integrated circuit 12. The heat spreader can spread, distribute or otherwise disperse heat from the integrated circuit 12 to protect the integrated circuit 12 and/or the package substrate 16 from being subjected to excessive temperatures, for example. In one embodiment, the heat spreader can be formed from a material having a relatively high thermal conductivity. For example, the heat spreader can be formed from a metallic material, or any other suitable material. The one or more insulators can surround the sides of the integrated circuit 12 to provide a protective barrier for the integrated circuit 12. Additionally, the insulator and can fill the gap that would otherwise exist between the heat spreader and the package substrate 16 to provide structural stability. In one embodiment, the insulator can be formed from a substantially non-conductive material, such as a dielectric material or another suitable material.

The printed circuit board 14 includes a flat board that is made of non-conducting material and a plurality of pre-defined conductive metal pathways that are printed on the surface of the board. In one embodiment, the printed circuit board 14 includes power 14A (illustrated in phantom as a box) and a ground 14B (illustrated in phantom as a box).

The package substrate 16 electrically connects the integrated circuit 12 to the printed circuit board 14. In certain embodiments, the package substrate 16 also fixedly secures the integrated circuit 12 to the printed circuit board 14 and provides mechanical support to the integrated circuit 12. The design of the package substrate 16 can vary. For example, in FIG. 1, the package substrate 16 is designed to electrically connect a flip type chip 12 to the printed circuit board 14. Alternatively, the package substrate 16 could be designed to electrically connect a wire bond type chip to the printed circuit board 14.

Figure 2:
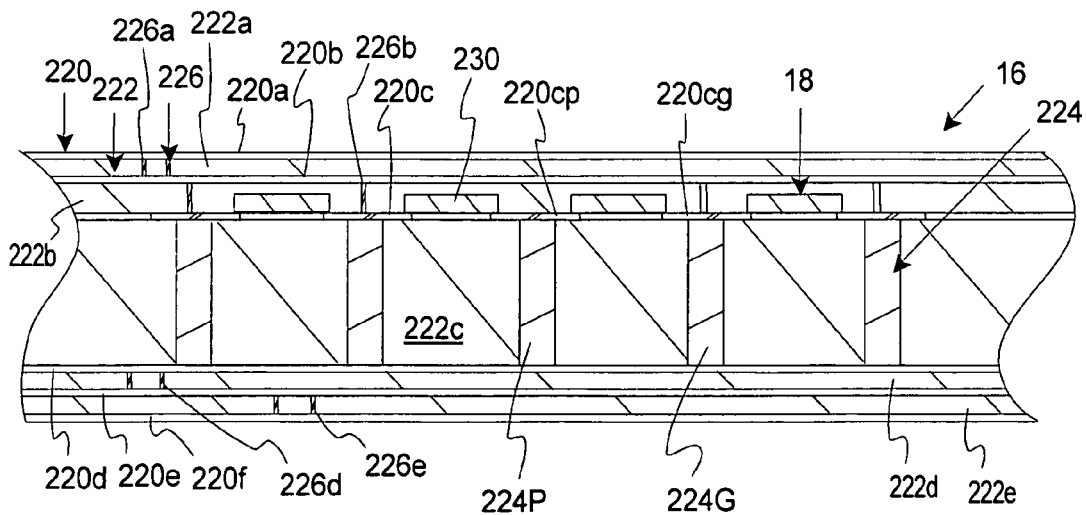
FIG. 2 is an enlarged, simplified cross-sectional view of a portion of a package substrate having features of the present invention.

FIG. 2 is an enlarged, simplified cross-sectional view of a portion of the package substrate 16 of FIG. 1 that electrically connects the integrated circuit 12 (illustrated in FIG. 1) to the printed circuit board 14 (illustrated in FIG. 1). In one embodiment, the package substrate 16 includes a plurality of spaced apart patterned conductive layers 220, a plurality of spaced apart insulating layers 222, a plurality of core vias 224 (only a few are illustrated in FIG. 2), a plurality of micro-vias 226 (only a few are illustrated in FIG. 2), and the capacitor assembly 18. The design and number of each of these components can be varied to achieve the design requirements of the package substrate 16.

In FIG. 2, the package substrate 16 includes six spaced apart patterned conductive layers 220. These conductive layers 220 can be labeled from top to bottom as the first conductive layer 220a, the second conductive layer 220b, the third conductive layer 220c, the fourth conductive layer 220d, the fifth conductive layer 220e, and the sixth conductive layer 220f. Alternatively, the package substrate 16 could be designed to have more than six or fewer than six spaced apart patterned conductive layers 220. The conductive material used in the conductive layers 220 can vary. A suitable conductive material is copper.

The first conductive layer 220a can include a plurality of mount pads (not shown) that are used to electrically and mechanically connect the integrated circuit 12 to the package substrate 16. Somewhat similarly, the sixth conductive layer 220f can include a plurality of mount pads (not shown) that are used to electrically and mechanically connect the package substrate 16 to the printed circuit board 14.

It should be noted that the use of the terms "first", "second", "third", etc., with regard to the conductive layers is for the sake of convenience and ease in understanding the invention only and are not intended to be limiting in any manner. In other words, any of the conductive layers 220 can be the "first conductive layer", the "second conductive layer", or the "third conductive layer", etc.

Additionally, for the third conductive layer 220c, five rails are illustrated for reference. In this embodiment, three of the rails are electrically connected to the power 14A and can be labeled as power rails 220cp, and two of the rails are electrically connected to the ground 14B and can be labeled as ground rails 220cg.

The insulating layers 222 mechanically and electrically separate the conductive layers 220. The number of insulating layers 222 will depend upon the number of conductive layers 220. In FIG. 2, the insulating layers 222 can be labeled from top to bottom as the first insulating layer 222a, the second insulating layer 222b, the third insulating layer 222c (also referred to as the "core layer"), the fourth insulating layer 222d, and the fifth insulating layer 222e. In this embodiment, (i) the first insulating layer 222a separates and isolates the first and second conductive layers 220a, 220b, (ii) the second insulating layer 222b separates and isolates the second and third conductive layers 220b, 220c, (iii) the core 222c separates and isolates the third and fourth conductive layers 220c, 220d, (iv) the fourth insulating layer 222d separates and isolates the fourth and fifth conductive layers 220d, 220e, and (v) the fifth insulating layer 222e separates and isolates the fifth and sixth conductive layers 220e, 220f.

The insulating material used in the insulating layers 222 can vary. Suitable materials for the insulating material include dielectrics, such as glass epoxy.

It should be noted that the use of the terms "first", "second", "third", etc., with regard to the insulating layers is for the sake of convenience and ease in understanding the invention only and are not intended to be limiting in any manner. In other words, any of the insulating layers 220 can be the "first insulating layer", the "second insulating layer", or the "third insulating layer", etc.

The vias 224, 226 are formed in the insulating layers 222 and can electrically connect any two patterned conductive layers 220. The vias 224, 226 electrically connect the conductive layers 220 to the power 14A and the ground 14B on the circuit board 14.

The plurality of core vias 224 are electrically conductive paths that extend through the core layer 222c and that electrically connect the fourth conductive layer 220d to the third conductive layer 220c. The number and location of the core vias 224 can vary. In FIG. 2, only five core vias 224 are illustrated. In this embodiment, (i) three of the core vias 224 are connected to the power 14A and the power rails 220cp, and can be labeled as power core vias 224P; and (ii) two of the core vias 224 are connected to the ground 14B and the ground rails 220cg, and can be labeled as ground core vias 224G. Suitable conductive material for the core vias 224 include copper.

The plurality of micro-vias 226 are electrically conductive paths that extend through one or more of the conductive layers 220 and that electrically connect the two conductive layers 220. The number and location of the micro-vias 226 can vary. In FIG. 2, (i) two first micro-vias 226a that extend through the first insulating layer 222a are illustrated, (ii) two second micro-vias 226b that extend through the second insulating layer 222b are illustrated, (iii) two fourth micro-vias 226d that extend through the fourth insulating layer 222d are illustrated, and (i) two fifth micro-vias 226e that extend through the fifth insulating layer 222d are illustrated for reference. Suitable conductive material for the micro-vias 226 include copper.

The capacitor assembly 18 provides power to the integrated circuit 12 during high frequency current transients. The design and location of the capacitor assembly 18 can vary pursuant to the teachings provided herein. In certain embodiments, the capacitor assembly 18 is physically very close to the integrated circuit 12 and has a relatively low impedance path to the integrated circuit 12.

Further, in certain embodiments, the capacitor assembly 18 includes a plurality of spaced apart, discrete capacitors, 230 that are inserted and directly electrically connected to one of the patterned conductive layers 220. Further, one of the insulating layers covers the patterned conductive layer 220 and the discrete capacitors 230. In FIG. 2, the plurality of spaced apart, discrete capacitors 230 are inserted and directly electrically connected to third patterned conductive layer 220c.

Further, the second insulating layer 222b covers the third patterned conductive layer 220c and the discrete capacitors 230 and separates the capacitors 230. Alternatively, the some or all of the plurality of spaced apart, discrete capacitors 230 can be inserted and directly electrically connected to one of the other patterned conductive layers 220.

This placement of the capacitors 230 allows for use of a relatively large number of discrete capacitors 230 without taking up valuable space from the surface of the package substrate 16.

Figure 3:
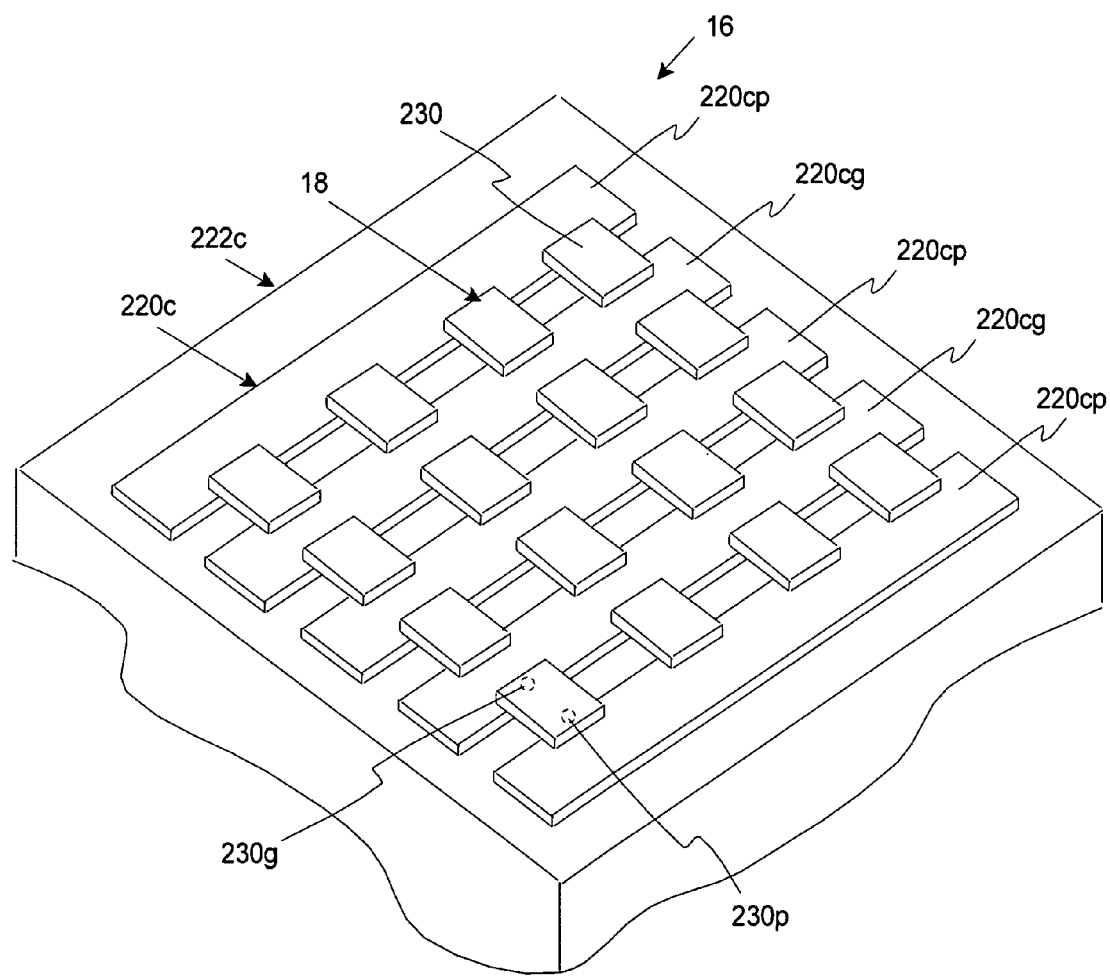
FIG. 3 is a simplified perspective view of a portion of the package substrate of FIG. 2.

FIG. 3 is a simplified perspective view of a portion of the core 222c, a portion of the third patterned conductive layer 220c, and a portion of the capacitor assembly 18 from FIG. 2. In this embodiment, the third patterned conductive layer 220c includes the plurality of spaced apart power rails 220cp and the plurality of spaced apart ground rails 220cg. More specifically, in this embodiment, the power rails 220cp and the ground rails 220cg are interspersed with one another. The power rails 220cp are electrically connected with one or more of the vias 224, 226 to the power 14A (illustrated in FIG. 1) and the ground rails 220cg are electrically connected with one or more of the vias 224, 226 to the ground 14B.

In FIG. 3, the third patterned conductive layer 220c includes three generally rectangular plate shaped power rails 220cp, and two generally rectangular plate shaped ground rails 220cg. Alternatively, the third patterned conductive layer 220c can include a different number of power rails 220cp and/or ground rails 220cg. Further, the power rails 220cp and the ground rails 220cg can have another shape or configuration.

In FIG. 3, the capacitor assembly 18 includes sixteen, spaced apart, and discrete capacitors 230 that are arranged in a 4×4 rectangular array. Alternatively, capacitor assembly 18 can include more or less than sixteen discrete capacitors 230 and/or the capacitors 230 can be arranged in another fashion.

Additionally, each of the discrete capacitors 230 includes a power electrode 230p (one is illustrated in phantom) that is directly and electrically connected to one of the power rails 220cp, and a ground electrode 230g (one is illustrated in phantom) that is directly and electrically connected to one of the ground rails 220cg. With this design, the capacitors 230 are positioned to provide a low inductance path and power to the integrated circuit 12. Stated in another fashion, the capacitors 230 provide easy access to quick power. Further, the capacitors 230 are adjacent to the rails 220cg, 220cp.

In one embodiment, each of the discrete capacitors 230 is a premade, low inductance capacitor 230 that is added to the package substrate 16 during manufacturing. For example, suitable capacitors 230 include surface mounted, low inductance capacitors sold by AVX, having a sales office in Santa Clara, Calif.

Referring back to FIG. 2, one non-exclusive example of a process that can be used to manufacture the package substrate 16 includes the steps of: (i) providing the rigid core 222c including an insulating layer and a pair of spaced apart conductive layers deposited on the insulating layer, (ii) creating holes in the core 222c, and subsequently coating the holes with conductive material using electroplating to form the core vias 224, (iii) etching conductive material to from the core 22C to form the third conductive layer 220c, (iv) placing a plurality of pre-made, spaced apart capacitors 230 on the third conductive layer 220c and electrically connecting the capacitors 230 to the third conductive layer 220c, (v) depositing insulation material on the third conductive layer 220c and the capacitors 230 to form the second insulation layer 222b, (vi) creating holes in the second insulation layer 222b and subsequently coating the holes with conductive material using electroplating to form the micro-vias 226, (vii) depositing conductive material on the top of the second insulation layer 222b and etching the conductive material to form the second conductive layer 220b, (viii) depositing insulation material on the second conductive layer 220b to form the first insulation layer 222a, (ix) creating holes in the first insulation layer 222a and subsequently coating the holes with conductive material using electroplating to form micro-vias 226, (x) depositing conductive material on the top of the first insulation layer 222a and etching the conductive material to form the first conductive layer 220a, (xi) etching the conductive material from the bottom of the core 222c to form the fourth conductive layer 220d, (xii) depositing insulation material on the fourth conductive layer 220d to form the fourth insulation layer 222d, (xiii) creating holes in the fourth insulation layer 222d and subsequently coating the holes with conductive material using electroplating to form micro-vias 226, (xiv) depositing conductive material on the bottom of the fourth insulation layer 222d and etching the conductive material to form the fifth conductive layer 220e, (xv) depositing insulation material on the fifth conductive layer 220e to form the fifth insulation layer 222e, (xvi) creating holes in the fifth insulation layer 222e and subsequently coating the holes with conductive material using electroplating to form the micro-vias 226, and (xvii) depositing conductive material on the bottom of the fifth insulation layer 222e and etching the conductive material to form the sixth conductive layer 220f.

It should be noted that one or more of the steps outlined above can switched in order or omitted.

While the particular invention as herein shown and disclosed in detail are fully capable of obtaining the objects and providing the advantages herein before stated, it is to be understood that they are merely illustrative of one or more embodiments and that no limitations are intended to the details of construction or design herein shown other than as described in the appended claims.

What is claimed is:

1. A package substrate for electrically connecting an integrated circuit to a printed circuit board, the package substrate comprising:
   a first insulating layer;
   a patterned conductive layer positioned on the first insulating layer;
   a plurality of spaced apart, discrete capacitors that are positioned directly adjacent to the patterned conductive layer and that are electrically connected to the patterned conductive layer; and
   a second insulating layer that covers the patterned conductive layer and separates the capacitors, wherein the second insulating layer does not separate the capacitors from the patterned conductive layer.

2. The package substrate of claim 1 wherein the patterned conductive layer includes a ground rail and a power rail that are positioned in the same plane, and wherein at least one of the capacitors extends between and is directly electrically connected to the ground rail and the power rail.

3. The package substrate of claim 2 wherein the plurality of spaced apart capacitors extend between and are directly electrically connected to the ground rail and the power rail.

4. The package substrate of claim 1 wherein the patterned conductive layer includes a plurality of spaced apart ground rails and a plurality of spaced apart power rails and wherein each of the capacitors extends between one of the ground rails and one of the power rails.

5. The package substrate of claim 1 wherein at least one of the capacitors is a surface mounted, low inductance capacitor.

6. A digital system comprising: an integrated circuit, a printed circuit board, and the package substrate of claim 1 that electrically connects the integrated circuit to the printed circuit board.

7. The digital system of claim 6 wherein the printed circuit board includes power and a ground and wherein the patterned conductive layer is electrically connected to the power and the ground.

8. A package substrate for electrically connecting an integrated circuit to a printed circuit board, the package substrate comprising:
  a core insulating layer;
  a patterned conductive layer positioned on the core insulating layer, the patterned conductive layer including a ground rail and a power rail that are positioned spaced apart in the same plane;
  a plurality of spaced apart, discrete capacitors electrically connected to the ground rail and the power rail; and
  a second insulating layer that covers the patterned conductive layer and the capacitors.

9. The package substrate of claim 8 wherein at least one of the capacitors extends between and is directly electrically connected the ground rail and the power rail.

10. The package substrate of claim 8 wherein the plurality of spaced apart capacitors extend between and are directly electrically connected to the ground rail and the power rail.

11. The package substrate of claim 8 wherein the discrete capacitors are positioned directly adjacent to the patterned conductive layer.

12. The package substrate of claim 8 wherein at least one of the capacitors is a surface mounted, low inductance capacitor.

13. A digital system comprising: an integrated circuit, a printed circuit board, and the package substrate of claim 8 that electrically connects the integrated circuit to the printed circuit board.

14. A method for making a package substrate for electrically connecting an integrated circuit to a printed circuit board, the method comprising the steps of:
  providing a first insulating layer;
  creating a patterned conductive layer on the first insulating layer;
  electrically connecting a plurality of spaced apart, pre-made, discrete capacitors to the patterned conductive layer;
  positioning the discrete capacitors directly adjacent to the patterned conductive layer; and
  covering the patterned conductive layer and the capacitors with a second insulating layer, wherein the second insulating layer does not separate the capacitors from the patterned conductive layer.

15. The method of claim 14 wherein the step of creating a patterned conductive layer includes creating a ground rail and a power rail, and wherein the step of electrically connecting includes the step of electrically connecting at least one of the capacitors between the ground rail and the power rail.

16. The method of claim 14 wherein the step of creating a patterned conductive layer includes creating a ground rail and a power rail, and wherein the step of electrically connecting includes the step of electrically connecting the plurality of capacitors between the ground rail and the power rail.

17. The method of claim 14 wherein the step of positioning includes the step of positioning the discrete capacitors directly against to the patterned conductive layer.

18. The package substrate of claim 1 wherein the discrete capacitors are positioned substantially directly against the patterned conductive layer.

19. The package substrate of claim 8 wherein the discrete capacitors are positioned substantially directly against the patterned conductive layer.

* * * * *